(12) United States Patent
Williams

(10) Patent No.: US 8,018,268 B1
(45) Date of Patent: Sep. 13, 2011

(54) OVER-VOLTAGE TOLERANT INPUT CIRCUIT

(75) Inventor: Timothy John Williams, Bellevue, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 615 days.

(21) Appl. No.: 11/273,825

(22) Filed: Nov. 15, 2005

Related U.S. Application Data

(60) Provisional application No. 60/629,418, filed on Nov. 19, 2004.

(51) Int. Cl.
*H03K 3/01* (2006.01)

(52) U.S. Cl. .......................... 327/534; 326/83

(58) Field of Classification Search .................. 326/82, 326/83; 327/112, 534
See application file for complete search history.

(56) References Cited

U.S. PATENT DOCUMENTS

| | | | |
|---|---|---|---|
| 4,472,647 A | 9/1984 | Allgood et al. | |
| 4,555,642 A | 11/1985 | Morales | |
| 4,642,488 A | 2/1987 | Parker | |
| 4,698,526 A | 10/1987 | Allan | |
| 4,763,021 A | 8/1988 | Stickel | |
| 4,782,250 A | 11/1988 | Adams et al. | |
| 4,825,415 A | 4/1989 | Nakaizumi | |
| 4,930,112 A | 5/1990 | Tanaka et al. | |
| 4,937,700 A | 6/1990 | Iwahashi | |
| 4,963,766 A | 10/1990 | Lundberg | |
| 4,964,084 A | 10/1990 | Jung et al. | |
| 5,115,150 A | 5/1992 | Ludwig | |
| 5,117,177 A | 5/1992 | Eaton, Jr. | |
| 5,144,165 A | 9/1992 | Dhong | |
| 5,144,167 A | 9/1992 | McClintock | |
| 5,151,619 A | 9/1992 | Austin et al. | |
| 5,160,855 A * | 11/1992 | Dobberpuhl | 327/108 |
| 5,247,212 A | 9/1993 | Vinal | |
| 5,266,849 A | 11/1993 | Kitahara | |
| 5,268,599 A | 12/1993 | Matsui | |
| 5,300,832 A | 4/1994 | Rogers | |
| 5,329,184 A | 7/1994 | Redfern | |
| 5,338,978 A | 8/1994 | Larsen | |
| 5,359,240 A | 10/1994 | Sandhu | |
| 5,359,243 A | 10/1994 | Norman | |
| 5,381,061 A | 1/1995 | Davis | |
| 5,396,128 A * | 3/1995 | Dunning et al. | 326/68 |
| 5,406,139 A | 4/1995 | Sharpe-Geisler | |

(Continued)

OTHER PUBLICATIONS

USPTO Notice of Allowance for U.S. Appl. No. 09/852,185 dated Jul. 26, 2002; 4 pages.

(Continued)

*Primary Examiner* — Lincoln Donovan
*Assistant Examiner* — William Hernandez

(57) ABSTRACT

An over-voltage tolerant input circuit has a pad. An Nwell bias circuit is electrically coupled to the pad. A current block circuit is electrically coupled to the Nwell bias circuit. The current block circuit has a control signal coupled to a gate of a transistor in a current path of the Nwell bias circuit. The current block circuit includes a logic gate having a first input coupled to the pad and a second input coupled to an over voltage signal of the Nwell bias circuit. An output of the logic gate is the control signal. An n-type transistor is coupled between the over voltage signal and the first input of the logic gate. A transistor has a gate electrically coupled to the control signal and has a drain coupled to the first input of the logic gate.

15 Claims, 4 Drawing Sheets

U.S. PATENT DOCUMENTS

| | | | |
|---|---|---|---|
| 5,444,397 A | | 8/1995 | Wong |
| 5,450,025 A * | | 9/1995 | Shay .................. 326/81 |
| 5,451,889 A | | 9/1995 | Heim et al. |
| 5,455,527 A | | 10/1995 | Murphy et al. |
| 5,455,532 A | | 10/1995 | Bass |
| 5,467,031 A * | | 11/1995 | Nguyen et al. ........... 326/81 |
| 5,510,738 A | | 4/1996 | Gorecki et al. |
| 5,543,733 A * | | 8/1996 | Mattos et al. ........... 326/81 |
| 5,546,020 A | | 8/1996 | Lee et al. |
| 5,555,149 A | | 9/1996 | Wert et al. |
| 5,570,043 A | | 10/1996 | Churchill |
| 5,574,678 A | | 11/1996 | Gorecki |
| 5,576,635 A | | 11/1996 | Partovi et al. |
| 5,635,860 A | | 6/1997 | Westerwick |
| 5,661,414 A * | | 8/1997 | Shigehara et al. ........... 326/81 |
| 5,767,733 A | | 6/1998 | Grugett |
| 5,825,206 A * | | 10/1998 | Krishnamurthy et al. ...... 326/81 |
| 5,844,425 A * | | 12/1998 | Nguyen et al. ........... 326/58 |
| 5,880,602 A | | 3/1999 | Kaminaga et al. |
| 5,914,844 A | | 6/1999 | Lutley et al. |
| 6,049,242 A | | 4/2000 | Lutley et al. |
| 6,147,511 A * | | 11/2000 | Patel et al. ........... 326/81 |
| 6,181,193 B1 * | | 1/2001 | Coughlin, Jr. ........... 327/534 |
| 6,265,926 B1 * | | 7/2001 | Wong ........... 327/318 |
| 6,320,415 B1 * | | 11/2001 | Lee ........... 326/81 |
| 6,353,333 B1 | | 3/2002 | Curd et al. |
| 6,496,044 B1 * | | 12/2002 | Nguyen et al. ........... 327/108 |
| 6,496,054 B1 * | | 12/2002 | Prather et al. ........... 327/534 |
| 6,545,506 B1 * | | 4/2003 | Chang ........... 326/83 |
| 6,628,149 B2 * | | 9/2003 | Ajit ........... 327/108 |
| 6,897,688 B2 * | | 5/2005 | Lee et al. ........... 327/112 |
| 6,970,024 B1 * | | 11/2005 | Reese et al. ........... 327/112 |
| 6,998,880 B2 * | | 2/2006 | Muller et al. ........... 327/108 |
| 7,088,140 B1 * | | 8/2006 | Nguyen et al. ........... 326/81 |
| 7,138,836 B2 * | | 11/2006 | Ajit et al. ........... 327/108 |
| 2002/0175743 A1 * | | 11/2002 | Ajit ........... 327/534 |
| 2004/0124890 A1 * | | 7/2004 | Muller et al. ........... 327/112 |
| 2005/0127957 A1 * | | 6/2005 | Ajit ........... 327/112 |

OTHER PUBLICATIONS

USPTO Non-Final Rejection for U.S. Appl. No. 09/852,185 dated Mar. 28, 2002; 4 pages.

USPTO Notice of Allowance for U.S. Appl. No. 08/381,125 dated May 1, 1996; 1 page.

USPTO Non-Final Rejection for U.S. Appl. No. 08/381,125 dated Nov. 2, 1995; 5 pages.

USPTO Non-Final Rejection for U.S. Appl. No. 08/381,125 dated Jul. 11, 1995; 4 pages.

USPTO Notice of Allowance for U.S. Appl. No. 08/949,863 dated Nov. 23, 1998; 5 pages.

USPTO Non-Final Rejection for U.S. Appl. No. 08/949,863 dated Mar. 9, 1998; 9 pages.

USPTO Final Rejection for U.S. Appl. No. 08/949,863 dated Aug. 13, 1998; 4 pages.

Daniel W. Dobberpuhl et al., "A 200-MHz 64-b Dual-Issue CMOS Microprocessor" IEEE Journal of Solid-State Circuits, vol. 27, No. 11, pp. 1555-1567 (Nov. 1992).

Rakesh Patel, et al., a 3.3-V Programmable Logic Device that Addresses Low Power Supply and Interface Trends, 1997, IEEE Custom Integrated Circuits Conference.

Marcel J. M. Pelgrom, et al., A 3/5 V Compatible I/O Buffer, Jul. 1995, IEEE Journal of Solid-State Circuits, vol. 30, No. 7.

Makoto Ueda, et al., A 3.3V ASIC for Mixed Voltage Applications with Shut Down Mode, 1993, IEEE Custom Integrated Circuits Conference.

* cited by examiner ial patent
OVER-VOLTAGE TOLERANT INPUT CIRCUIT

RELATED APPLICATIONS

The present invention claims priority on provisional patent application Ser. No. 60/629,418, filed on Nov. 19, 2004, entitled "Overvoltage Tolerant Input Circuit with Zero DC Load Current" and is hereby incorporated by reference.

FIELD OF THE INVENTION

The present invention relates generally to the field of electronic circuits and more particularly to an over-voltage tolerant circuit.

BACKGROUND OF THE INVENTION

Low voltages are widely used in industry to reduce power, and most modern semiconductor devices are designed to operate on low voltages. However, many semiconductor devices are used in systems where higher voltages are used as inputs, outputs, etc. Microcontroller applications often interface to devices at different voltages, and high impedance interfaces are often required for low power applications and high integrity interface levels. In practice, many semiconductor devices need to be able to handle input voltages that exceed the supply voltage of the device. It is a challenge for a designer to make the device capable of tolerating such over voltages at an input pin without drawing any direct (DC) current from the external driving source. Tolerating over voltages (i.e. input voltages that exceed the device supply voltage) typically involves allowing wells to float up with the over-voltage signal. PMOS (P-type Metal Oxide Semiconductor) devices may have their nwell (body/bulk) connected in a "floating" configuration which keeps it at the device supply voltage during normal operation, but when an input exceeds the supply voltage, the nwell voltage rises with that input voltage. In this way, PMOS devices connected to the pad can avoid having their well-diodes forward biased, which would load the pad in an undesirable way. However, in order to accomplish this, some amount of DC current is typically drawn from the over-voltage source as long as it persists at voltages exceeding the device supply voltage. This input current load is often undesirable, and may not be tolerable in some applications.

FIG. 1 shows a conventional input circuit 10 having a load current. The conventional input circuit 10 has the pad 12 coupled to a Nwell bias circuit 14. The Nwell bias circuit 14 has an output (Nwell Bias) that is coupled to the body of the p-type transistor 16. The source 18 of the transistor 16 is coupled to the supply voltage 20. The drain 22 of the transistor 16 is coupled to the pad 12 and to the drain 24 of n-type transistor 26. The source 28 of the transistor 26 is coupled to ground 30. The pad 12 is coupled to a buffer circuit 32. FIG. 2 shows a detailed version of the conventional input circuit 10. In FIG. 2, devices 40, 42, 44 provide the DC current path during over-voltage. These are used to control the voltage of the body of transistor 16, which determines whether the Nwell bias signal will be set to the device supply or allowed to float up with the pad's over voltage (through transistor 46). The weak discharge devices, transistors 42, 44, allow the over-voltage (overv) signal 48 to return low once the over-voltage is removed.

It would be desirable to have an input circuit having low or zero DC load current.

SUMMARY OF THE INVENTION

An over-voltage tolerant input circuit that overcomes these and other problems has a pad. A Nwell bias circuit is electrically coupled to the pad. A current block circuit is electrically coupled to the Nwell bias circuit. The current block circuit may have a control signal coupled to a gate of a transistor in a current path of the Nwell bias circuit. The current block circuit may include a logic gate having a first input coupled to the pad and a second input coupled to an over voltage signal of the Nwell bias circuit. An output of the logic gate may be the control signal. An n-type transistor may be coupled between the over voltage signal and the first input of the logic gate. A transistor may have a gate electrically coupled to the control signal and have a drain coupled to the first input of the logic gate. The transistor may have a source coupled to a power supply voltage.

In one embodiment, a circuit for providing over-voltage tolerance has a p-type transistor with a body coupled to an Nwell bias signal. A Nwell bias circuit has as an output the Nwell bias signal and is coupled to a pad. A current block circuit controls a current of the Nwell bias circuit. The current block circuit may have an over-voltage signal from the Nwell bias circuit as an input. The current block circuit may have a second input coupled to the pad. The over-voltage signal may be coupled to a drain of an n-type transistor. The n-type transistor may be coupled to an input of a logic gate. The gate of the n-type transistor may be coupled to a power supply voltage. An n-type transistor having a drain may be coupled to the drain of the p-type transistor.

In one embodiment, a circuit for providing over-voltage tolerance has a p-type transistor with a body coupled to an Nwell bias signal and a source coupled to a power supply voltage. An Nwell bias circuit has as an output the Nwell bias signal and is coupled to a pad. A current block circuit controls a current of the Nwell bias circuit. A voltage at the pad may exceed the voltage of the power supply voltage. The current block circuit may include a logic gate having an output coupled to a gate of a n-type transistor in the Nwell bias circuit. An input to the logic gate may be coupled to the pad. A second input to the logic gate may be coupled to the source of an n-type transistor. The drain of the n-type transistor may be coupled to an over-voltage signal.

DETAILED DESCRIPTION OF THE DRAWINGS

The over-voltage tolerant input circuit described herein does not result in a current drain during an over-voltage condition. Note that an over-voltage condition exists when the voltage at the PAD is greater than the voltage of the internal power supply.

Figure 1:
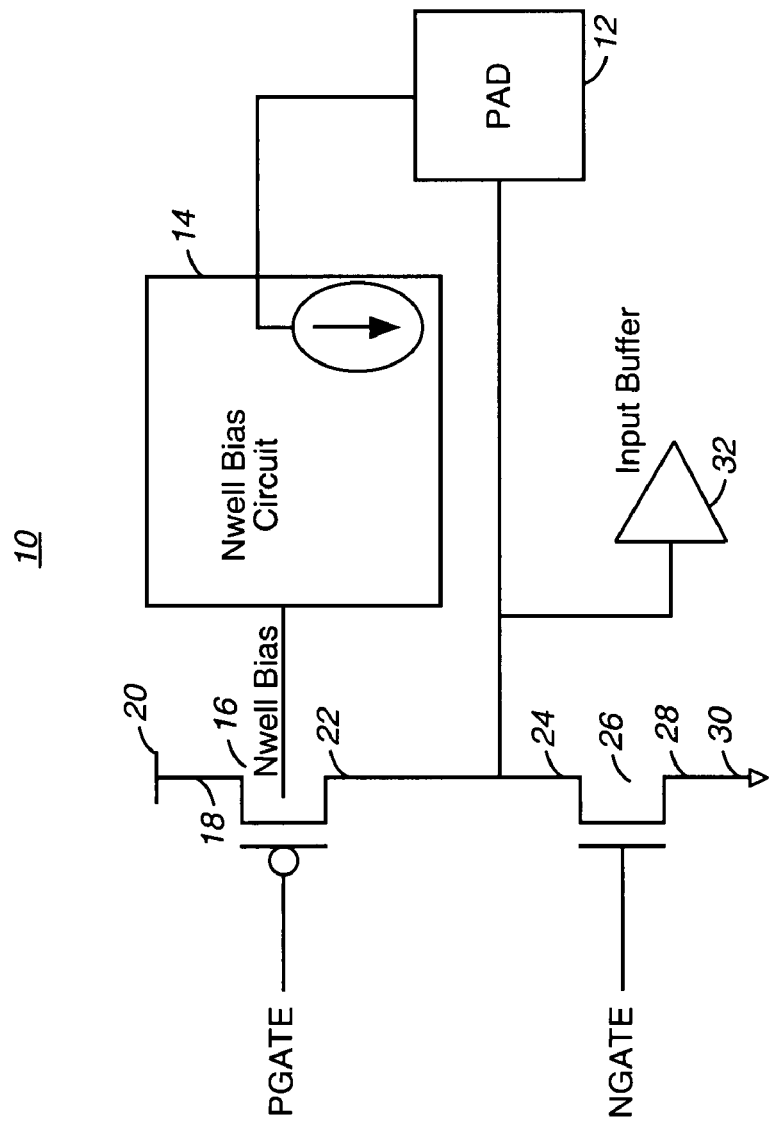
FIG. 1 is a block diagram of a conventional over-voltage tolerant input circuit.
Figure 2:
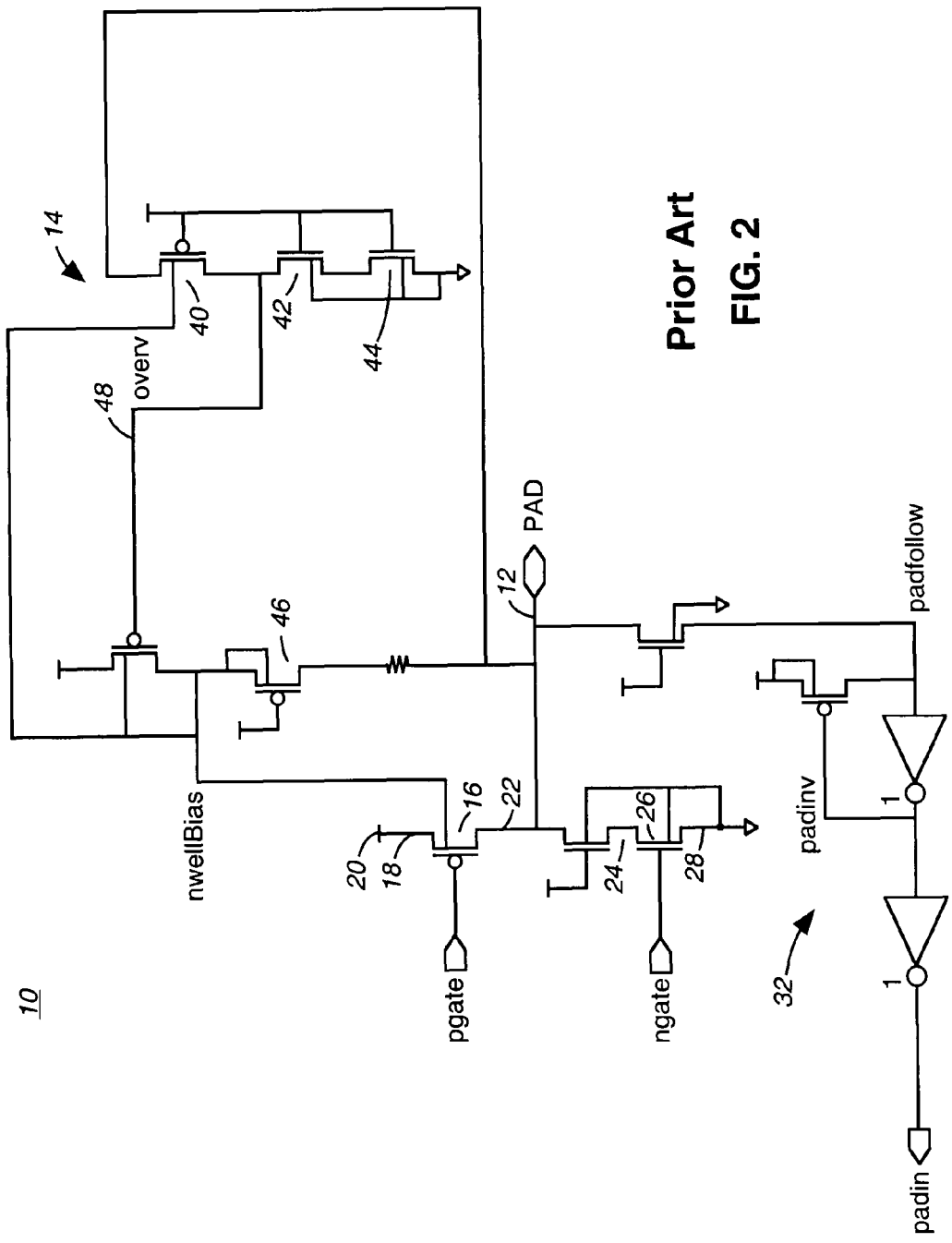
FIG. 2 is a detail view of the circuit of FIG. 1.
Figure 3:
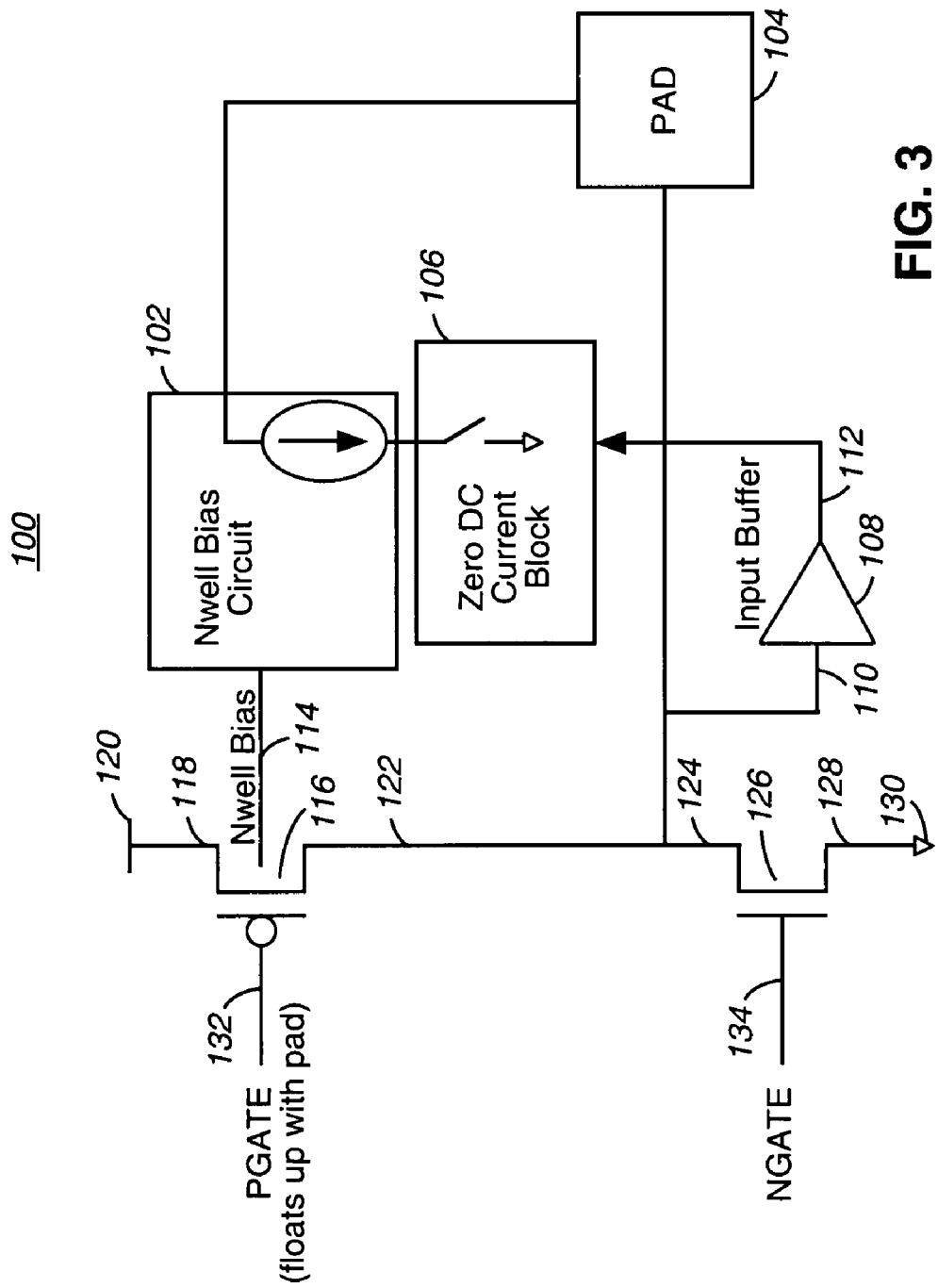
FIG. 3 is a block diagram of an over-voltage tolerant input circuit in accordance with one embodiment of the invention.

FIG. 3 is a block diagram of an over-voltage tolerant input circuit 100 in accordance with one embodiment of the invention. The circuit includes a Nwell bias circuit 102 coupled to the PAD 104. A current block circuit 106 is coupled to the Nwell bias circuit 102. An input buffer circuit 108 has an input 110 coupled to the PAD 104 and an output 112 to the current block circuit 106. The output of the Nwell Bias circuit 102 is the Nwell bias signal 114. The Nwell bias signal 114 is coupled to the body or bulk of the p-type transistor 116. The source 118 of the transistor 116 is coupled to the power supply voltage 120. The drain 122 of transistor 116 is coupled to the drain 124 of transistor 126, the input buffer circuit 108 and the pad 104. The source 128 of the n-type transistor 126 is coupled to ground 130. The gate 132 of transistor 116 forms the PGATE signal and the gate 134 of transistor 126 forms the NGATE signal. When the voltage at PAD 104 exceeds the power supply voltage 120, the Nwell bias circuit 102 detects the over-voltage condition and raises the voltage of the Nwell Bias signal 114. This keeps the transistor 116 from having its well-diodes forward biased. The over-voltage condition results in a current flow that is detected by the current block circuit 106. The current block circuit 106 then blocks the flow of the current from the Nwell Bias Circuit 102.

The improved circuit may be used in various electronic components, particularly microcontrollers/microprocessors that frequently interface to devices of various voltages. The improved circuit may be located at each Input/Output pad, normally several per device.

This improved input circuit adds circuitry to turn off an input current once the input has switched to the over-voltage state. The circuitry to turn off an input current is described with FIG. 4. It operates by sensing the state of the input PAD and using that information to control the discharge current.

The improved input circuit comprises devices that keep all critical junctions below breakdown voltages. This allows (in one example) tolerance of 5V signals using only devices that can individually handle 3V. It is desirable to keep the junctions below breakdown voltage of the device.

Figure 4:
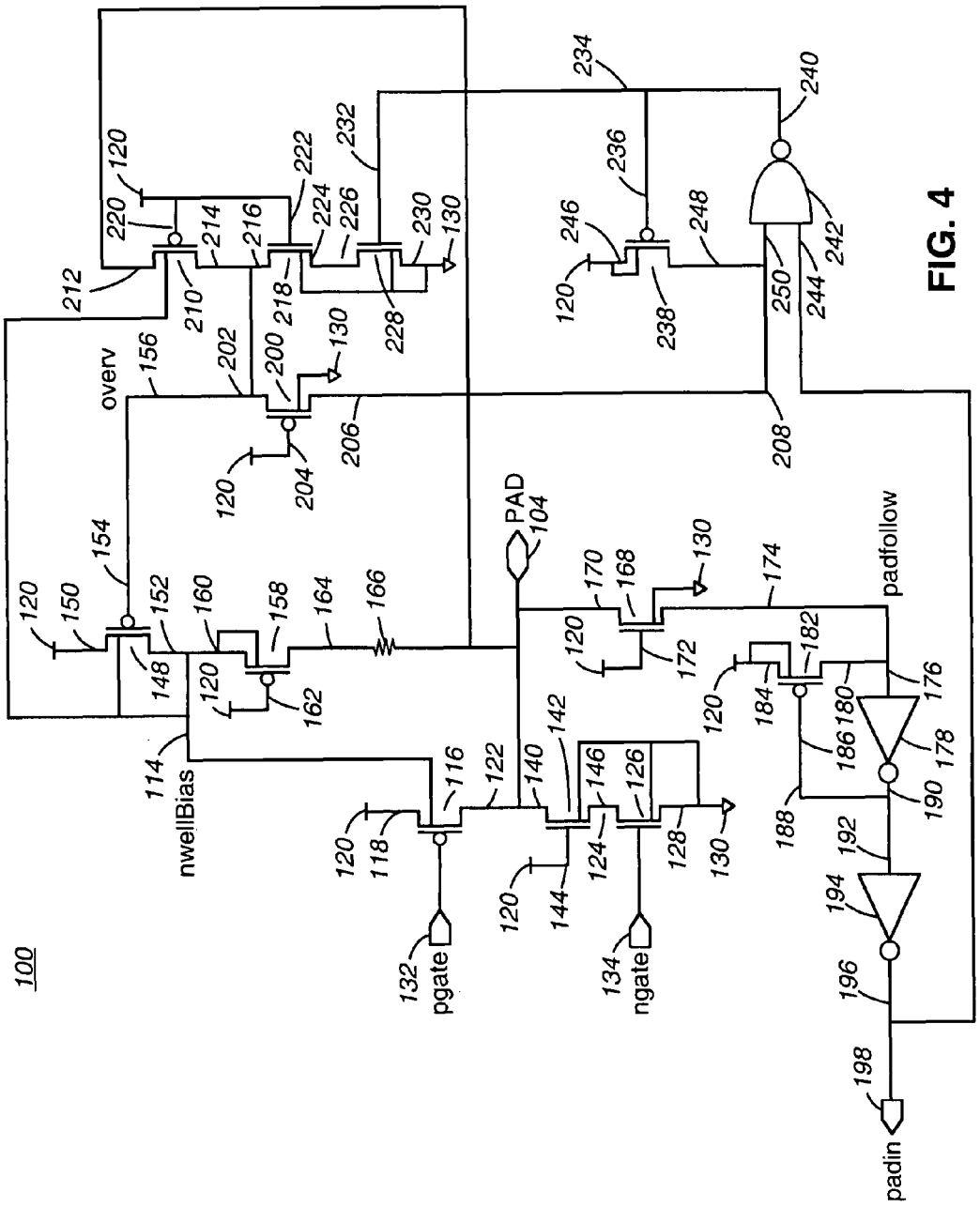
FIG. 4 is a detail view of the circuit of FIG. 3.

FIG. 4 shows a detailed view of the improved input circuit of FIG. 3. FIG. 4 represents an input/output circuit, capable of alternately driving signals out or receiving input signals external to the device. The improved circuit comprises a first transistor 116, wherein a signal PGATE 132 (the control signal for the pmos output transistor, part of the conventional output) is coupled to the gate of transistor 116. The source 118 of transistor 116 is coupled to power (VDD) 120. The bulk of transistor 116 is coupled to an Nwell bias voltage (NwellBias) 114. The drain 122 of transistor 116 is coupled to the PAD signal 104 and also to the drain 140 of n-type transistor 142. Transistor 142 has its gate 144 coupled to VDD 120. This is a shielding or level-shifting device that keeps device, transistor 126, from seeing high voltages on its drain 124. The source 146 of transistor 142 is coupled to the drain 124 of transistor 126, wherein a signal 'NGATE' (the control input for the nmos output driver) 134 is coupled to the gate of transistor 126. The source 128 of transistor 126 is coupled to ground 130, as are the bulk of transistor 126 and the bulk of transistor 142.

The circuit 100 further comprises p-type transistor 148, where the source 150 of transistor 148 is connected to power (Vdd) 120 and the drain 152 of transistor 148 is connected to the Nwell bias voltage (nwellBias) 114. The gate 154 of transistor 148 is coupled to an over-voltage signal (overv) 156. The circuit further includes a transistor 158, where the source 160 of transistor 158 is coupled to the Nwell bias voltage (nwellBias) 114, the gate 162 is connected to power (Vdd) 120, and the drain 164 of transistor 158 is coupled to a first end of a resistor 166. The second end of resistor 166 is coupled to the PAD signal 104. This circuitry drives the NwellBias signal above Vdd 120 when the external signal (at the PAD node 104) goes above Vdd 120. This is necessary to avoid forward biasing the nwells, which would draw large current from the input signal and potentially damage the device.

The circuit further includes a transistor 168 having a drain 170 coupled to the PAD signal 104, and a gate 172 coupled to power (VDD) 120. The source 174 of transistor 168 is coupled to a signal 'padfollow', transistor 168 limits the positive voltage excursion on the signal padfollow. The signal padfollow is coupled to the input 176 of inverter 178, and to the drain 180 of transistor 182. The source 184 of transistor 182 is coupled to power (VDD) 120. The gate 186 of transistor 182 is coupled to signal 'padinv' 188 which is coupled to the output 190 of inverter 178, and to the input 192 of inverter 194. The output 196 of inverter 194 is coupled to signal node 'PADIN' 198. This is the input buffer for the cell, and transistor 182 restores a high level at Vdd 120 whenever PAD 104 is at Vdd 120. Otherwise the level shifting device 168 would limit the voltage at padfollow to approximately a threshold voltage drop below Vdd, leading to unwanted bias currents in the inverter 178 and reduced input noise immunity.

The invention further includes transistor 200, having a drain 202 coupled to an overvoltage signal (overv) 156, and a gate 204 coupled to power (VDD) 120, and a source 206 coupled to a signal node 208. Transistor 200 functions to limit the voltage at the signal node 208. Transistor 210 has a bulk coupled to signal node 'Nwellbias' 114, and a source 212 coupled to the signal 'PAD' 104. The drain 214 of transistor 210 is coupled to the drain 216 of transistor 218 and also to the drain 202 of transistor 200. The gate 220 of transistor 210 and the gate 222 of transistor 218 are coupled to power (VCC, also referred to as Vdd or VDD) 120. The source 224 of transistor 218 is coupled to the drain 226 of transistor 228, and the source 230 of transistor 228 is connected to ground (GND) 130. The gate 232 of transistor 228 is connected to node 234, which is connected to the gate 236 of transistor 238 and to the output 240 of NAND gate 242. The input 244 of NAND gate 242 is coupled to the signal PADIN 198. The source 246 of transistor 238 is coupled to power VDD 120. The drain 248 of transistor 238 is coupled to the signal node 208 and the second input 250 of NAND gate 242.

In FIG. 4, the gate 232 of transistor 228 is controlled so that it can be turned off during an over-voltage condition. The operation of turning off transistor 228 removes the dc current otherwise present in transistors 210, 218, 228, loading the input. As the pad 104 voltage rises, the input buffer 178, 194 will register the high input state. When the pad 104 rises above the supply 120, it must overcome the weak load of transistor 218 and transistor 228, and then the NAND gate 242 will switch state, turning off the input current load on the pad 104. Transistor 200 is present to lower the voltage at the input of the NAND gate 242, which extends the voltage-range capability of this circuit. The signal overv 156 continues to follow the PAD 104 voltage while PAD 104 remains above Vdd 120, which keeps device 148 off during this condition.

The main advantage of this improved circuit is that it eliminates dc input current loading from the over-voltage source. A small transient current is required to switch the circuit. But during switching drivers must typically source a small current, and so this additional internal current should not be a drawback. In fact the switching current is approximately the same magnitude of the old circuit's dc load, assuming everything else is equal.

In alternate embodiment, various equivalent logic gates could be used to implement the improved circuit of FIG. 4. If devices are available that can tolerate higher voltages (e.g. 5V transistors in a device with a 3V supply), some of the cascode and voltage-dropping devices could be eliminated. Candidates are transistor 218 and transistor 200 and also transistor 142 and transistor 168.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved circuit and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An over-voltage tolerant input circuit, comprising:
    a pad;
    an N-well bias circuit electrically coupled to the pad, a portion of the N-well bias circuit configured to generate a direct current based on an over-voltage detection; and
    a current block circuit in the same current path as the N-well bias circuit and configured to block the flow of direct current from the portion of the N-well bias circuit when an over-voltage is detected.

2. The circuit of claim 1, wherein the current block circuit is configured to provide a control signal to a first transistor in the path of the direct current, the transistor configured to receive the control signal at its gate to block the direct current.

3. The circuit of claim 2, wherein the current block circuit includes logic having a first input coupled to the pad and a second input electrically coupled to an over-voltage signal.

4. The circuit of claim 3, wherein of the logic is configured to output the control signal.

5. The circuit of claim 4, further including a second transistor electrically coupled to the over-voltage signal and the first input of the logic gate.

6. The circuit of claim 5, further including the gate of the second transistor electrically coupled to the output of the logic.

7. The circuit of claim 6, wherein the source of the second transistor is coupled to a power supply voltage.

8. A circuit for providing over-voltage tolerance, the circuit comprising:
    an N-well bias circuit coupled to a pad and configured to provide an input current load based on an over-voltage detection; and
    a current block circuit, the same current path as the N-well bias circuit and responsive to the detected over-voltage, to turn off the input current load on the pad from the N-well bias circuit.

9. The circuit of claim 8, wherein the current block circuit includes logic wherein a first input is electrically coupled to an over-voltage signal and a second input coupled to the pad.

10. The circuit of claim 9, wherein the logic includes an output coupled to the gate of a first transistor configured to remove the input current load.

11. The circuit of claim 9, wherein the first input of the logic is coupled to a drain of a second transistor.

12. The circuit of claim 11, wherein the gate of the second transistor is coupled to the output of the logic output and the gate of the first transistor.

13. A method, comprising:
    sensing an over-voltage at a pad using an N-well bias circuit coupled to the pad, the N-well bias circuit configured to generate current based on an over-voltage detection; and
    blocking the generated current from the N-well bias circuit using a current block circuit in the same current path as the N-well bias circuit and responsive to the sensing of the over-voltage.

14. The method of claim 13, including receiving at the current block circuit an over-voltage signal from the N-well bias circuit when an over-voltage is sensed.

15. The method of claim 13, wherein the blocking of the generated current includes applying a signal to a transistor gate to turn off the current flow through the transistor.

* * * * *